United States Patent [19]

Ukaji

[11] Patent Number: 4,779,981
[45] Date of Patent: Oct. 25, 1988

[54] REJECT CHIP MARKING DEVICE AND METHOD OF DISCRIMINATING REJECT MARK

[75] Inventor: Takao Ukaji, Yokohama, Japan

[73] Assignee: Canon Kabushiki Kaisha, Tokyo, Japan

[21] Appl. No.: 788,786

[22] Filed: Oct. 18, 1985

[30] Foreign Application Priority Data

Oct. 22, 1984 [JP] Japan ................. 59-222653

[51] Int. Cl.⁴ ............................................. G01R 31/02
[52] U.S. Cl. ................. 356/237; 324/158 F; 324/158 P
[58] Field of Search ................ 356/237, 239, 244; 324/72.5, 73 PC, 158 F, 158 P; 29/274

[56] References Cited

U.S. PATENT DOCUMENTS

| | | | |
|---|---|---|---|
| 3,345,567 | 10/1967 | Turner et al. | 324/158 F |
| 3,437,929 | 4/1969 | Glenn | 324/158 F |
| 3,641,972 | 2/1972 | Hostetter | 324/158 P |
| 4,568,879 | 2/1986 | Nakamura et al. | 324/158 P |

Primary Examiner—Eugene R. Laroche
Assistant Examiner—Robert J. Pascal
Attorney, Agent, or Firm—Fitzpatrick, Cella, Harper & Scinto

[57] ABSTRACT

Each of the chips in a wafer is provided with a specific zone which is used exclusively for recording a mark representative of the result of the inspection of the chip, that is, whether or not the chip is to be rejected. The specific zone is located at a constant position in the individual chips. By checking a specific zone which is located at the same position irrespective of the individual chips, the discrimination is made whether or not the chip is to be rejected. The zone includes a pad which is separate from bonding pads used for inspection. The probe card used with those chips is provided with a marking element mounted in stationary position but is movable to mark the marking pad. The marking is effected by pressing the marking element on the marking pad so as to form an indentation. During the probing operation, the marking element is actuated in response to the prober discriminating that the chip is to be rejected, so that the marking pad associated with the rejected chip is indented.

2 Claims, 1 Drawing Sheet

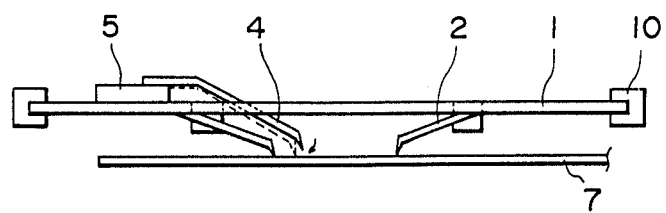
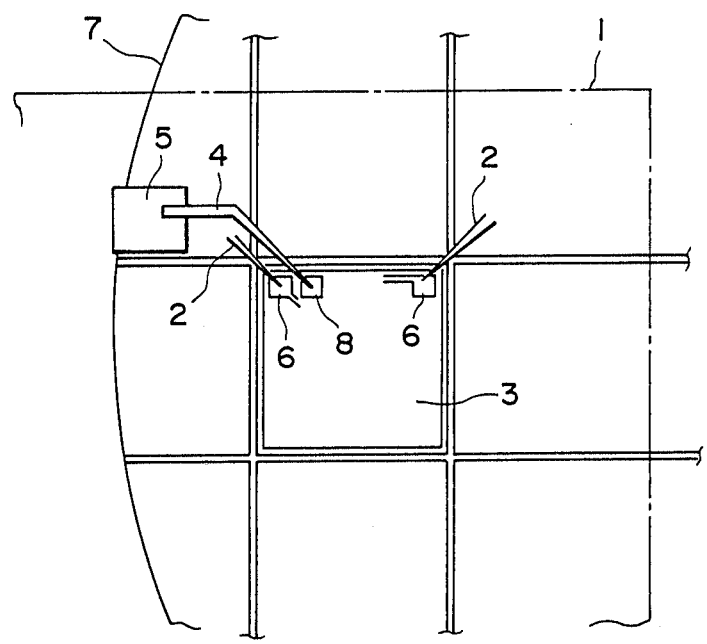
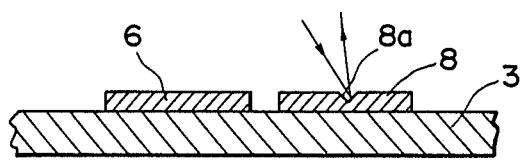

REJECT CHIP MARKING DEVICE AND METHOD OF DISCRIMINATING REJECT MARK

FIELD OF THE INVENTION AND RELATED ART

The present invention relates to a reject chip marking device and a method of discriminating the reject mark, more particularly, to such a device and a method conveniently usable with a prober for inspecting semiconductor circuit chips in the process of manufacturing semiconductor circuits. It is conventional that, prior to cutting a wafer into chips of semiconductor circuit, the electric performance of the circuit formed on the wafer is inspected, and a mark is recoded on those chips which should be rejected because of poor or unsatisfactory performance.

For the marking on the chips, there are an inking type system, a scratching type system and a laser beam type system.

In the inking type system, a fine needle supplied with ink is contacted on the top surface of the rejected chip. This is advantageous in that the means required are simple. However, there are disadvantages that the maintenance operation is quite cumbersome since the ink must be supplied periodically and since clogging can occur; that an oven (100°–200° C.) is required in order to dry the ink after the marking; and that the ink can scatter or drop on and damage the non-rejected chips.

In the scratching type system, the top surface of the rejected chip is scratched. This is disadvantageous in that the scratched-off pieces can damage the other chips.

In the laser beam type system, a laser beam is projected on the top surface of the rejected chip. This is disadvantageous in that is uses apparatus having a complicated and bulky structure and time-consuming operation. Those disadvantages are also common to the above-described two types.

SUMMARY OF THE INVENTION

Accordingly, it is a principal object of the present invention to provide a reject chip marking device and a marking of discriminating the reject mark by which the above-described drawbacks are not involved.

It is another object of the present invention to provide a reject chip marking device and a method of discriminating the reject mark, in which an oven is not required.

It is a further object of the present invention to provide a reject chip marking device and a method of discriminating the reject mark, in which the marking operation does not adversely affect the other chips.

According to an embodiment of the present invention, a zone is provided for each of the chips, the zone being substantially exclusively used for marking and discriminating whether the chip is to be rejected or not.

Therefore, the marking position is definitely determined, and the size of a driving mechanism for the marking can be reduced to such an extent that the marking mechanism can be unified with a probe card. If the unification is done, it is not necessary to specifically align the marking element with a chip if the probe card is aligned with the chip. In the embodiment, the marking is effected by indenting by pressure the marking zone with a marking element, the marking zone is outside the circuit-formed area of the chip. Therefore, there is nothing that can possibly scatter around the other chips, whereby the possible damage which may otherwise be caused by the marking action can be avoided. In the conventional marking systems, if a rejected chip is once marked, the chip is destroyed by the marking, and therefore, it is not possible to revive it. However, according to the embodiment of the present invention, the marking is made by the indentation on the marking zone outside the formed circuit, so that it is possible to revive it even after the reject mark is recorded.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a side view of a reject chip marking device according to an embodiment of the present invention.

FIG. 2 is a top plan view of the device of FIG. 1.

FIG. 3 is a sectional view illustrating a method of discriminating a reject mark according to an embodiment of the present invention.

DESCRIPTION OF THE PREFERRED EMBODIMENTS

Referring now to FIG. 1, there is shown a reject chip marking device according to an embodiment of the present invention. FIG. 2 is a top plan view of the same device. In those Figures, there are shown a probe card 1 provided with probe needles 2, a wafer 7 having chips 3 to be inspected with the probe needles 2. The probe needles 2 are press-contacted to bonding pads provided in the chip area so as to electrically connect the bonding pads to a probing circuit (not shown) to inspect the electrical characteristics and performance of the circuit formed in the chip. In this embodiment, the probe card 1 has a marking element or needle 4 mounted thereon for movement toward and away from the chip. The marking needle is effective to mark on a particular area or zone of a rejected chip. At least tip end portion of the marking needle 4 is of a relatively hard material, such as tungsten which is the same material as that of the probe needes 2 in this embodiment. The marking needle 4 is operatively coupled with an actuator 5 for causing the needle 4 press the chip at a predetermined position thereof which will be described hereinafter. The actuator may be an electromagnetic plunger or electromechanical converting device like a piezoelectric element.

The wafer 7 is provided with bonding pads 6 for connecting the circuit of the chip to the external circuit. When the chip is inspected, the bonding pads 6 are contacted by the probe needles 2. Additionally, the wafer 7 is provided with a marking pad 8 for each of the chips, which is adapted to being pressed by the marking needle 4 if the associated chip is to be rejected, so that an indentation is formed on the marking pad. The material of the bonding pad is aluminum, magnesium or the like. After the marking, it is discriminated by checking this pad whether or not the chip is one to be rejected. Thus, in this embodiment, there is provided a particular pad which is used exclusively to mark and discriminate the rejected chip. It is preferable to locate the marking pad adjacent to the bonding pad.

In operation, if the electric characteristic or performance inspected with the probe needles 2 is not satisfactory, the actuator 5 is energized by application of a voltage to move the marking needle 4 to the marking pad 8, with the result that the marking pad 8 is indented as shown in FIG. 3 by a reference numeral 8a. The indentation represents that the chip is to be rejected. When the discrimination is to be made as to whether the chips are rejected or not, the change or variation of reflection factor caused by the indentation is detected.

As described above, the chip 3 is provided with a marking pad 8 which is substantially exclusively for the discrimination between accepted and rejected chips. On the other hand, the probe card 1 is equipped with a marking needle 4 and the driving mechanism or actuator 5 thereof. Since the position of the marking pad 8 is definitely determined, it is not necessary to specifically perform an alignment operation for aligning the marking needle 4 and the marking pad 8, if the probe card 1 is aligned with the chip or more particularly to the bonding pads. It will be understood that there is no need to supply ink or to perform other maintenance operations. The marking device is not complicated, and further, it is possible to receive a marked chip if necessary, since the mark is outside the circuit-formed area of the chip. Additionally, the mere indentation does not produce such small pieces debris which can scatter, the marking operation does not damage the other chips which may be satisfactory.

It is possible to actuate the marking element 4 manually in response to the result of discrimination by the prober. Also, it is possible to provide a control device which is responsive to the output of the prober to actuate the marking element when necessary.

Also, it is a possible alternative that the bonding pad associated with a satisfactory chip is indented.

While the invention has been described with reference to the structures disclosed herein, it is not confined to the details set forth and this application is intended to cover such modifications or changes as may come within the purposes of the improvements or the scope of the following claims.

What is claimed is:

1. A method of discriminating a reject mark on a chip, comprising:
    providing a zone, on a chip, exclusively for being provided with a physical identifying mark if said chip is to be rejected;
    and
    projecting light onto the zone to discriminate whether or not the chip is to be rejected.

2. A semiconductor chip, comprising:
    a circuit pattern zone in which an electric circuit is formed;
    a pad zone in which pads electrically connected with the electric circuit are provided; and
    a dummy pad zone in which a dummy pad electrically isolated from the electric circuit is provided.

* * * * *

UNITED STATES PATENT AND TRADEMARK OFFICE
CERTIFICATE OF CORRECTION

PATENT NO. : 4,779,981
DATED : October 25, 1988
INVENTOR(S) : TAKAO UKAJI

Page 1 of 2

It is certified that error appears in the above-identified patent and that said Letters Patent is hereby corrected as shown below:

IN [56] REFERENCES CITED

"Fitzapatrick, Cella, Harper & Scinto" should read --Fitzpatrick, Cella, Harper & Scinto--.

COLUMN 1

Line 15, "recoded" should read --recorded--.
Line 36, "is" should read --it--.
Line 44, "marking" should read --method--.

COLUMN 2

Line 46, "press" should read --to press--.

COLUMN 3

Line 14, "thereof." should read --therefor.--.
Line 25, "pieces debris" should read --pieces of debris--.

UNITED STATES PATENT AND TRADEMARK OFFICE
CERTIFICATE OF CORRECTION

PATENT NO. : 4,779,981
DATED : October 25, 1988
INVENTOR(S) : TAKAO UKAJI

It is certified that error appears in the above-identified patent and that said Letters Patent is hereby corrected as shown below:

COLUMN 4

Line 17, "rejected;" should read --rejected; and--.
Line 18, "and" should be deleted.

Signed and Sealed this

Sixth Day of March, 1990

Attest:

JEFFREY M. SAMUELS

*Attesting Officer*   *Acting Commissioner of Patents and Trademarks*